(12) United States Patent
Kang et al.

(10) Patent No.: US 9,286,956 B2
(45) Date of Patent: Mar. 15, 2016

(54) MEMORY DEVICE, MEMORY MODULE INCLUDING THE MEMORY DEVICE, METHOD OF FABRICATING THE MEMORY MODULE, AND METHOD OF REPAIRING THE MEMORY MODULE

(71) Applicant: SAMSUNG ELECTRONICS CO., LTD., Suwon-Si, Gyeonggi-Do (KR)

(72) Inventors: Dan-Kyu Kang, Geyonggi-do (KR); Sang-Seok Kang, Gyeonggi-do (KR); Young-Man Ahn, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/320,796

(22) Filed: Jul. 1, 2014

(65) Prior Publication Data
US 2015/0062999 A1 Mar. 5, 2015

(30) Foreign Application Priority Data
Aug. 27, 2013 (KR) ........................ 10-2013-0101921

(51) Int. Cl.
G11C 17/00 (2006.01)
G11C 7/10 (2006.01)
G11C 16/32 (2006.01)
G11C 5/02 (2006.01)
G11C 11/406 (2006.01)
G11C 7/22 (2006.01)
G11C 11/4076 (2006.01)

(52) U.S. Cl.
CPC .............. *G11C 7/1066* (2013.01); *G11C 5/025* (2013.01); *G11C 7/1072* (2013.01); *G11C 7/1093* (2013.01); *G11C 7/222* (2013.01); *G11C 11/406* (2013.01); *G11C 11/4076* (2013.01); *G11C 11/40607* (2013.01); *G11C 16/32* (2013.01); *G11C 2207/2272* (2013.01); *G11C 2211/4061* (2013.01)

(58) Field of Classification Search
CPC ...... G11C 7/1072; G11C 16/32; G11C 5/025; G11C 11/406; G11C 11/40607; G11C 11/40618; H01L 2924/00; H01L 2224/48227; G06F 13/1636
USPC ........... 365/96, 189.05, 189.011, 222, 51, 63, 365/225.7
See application file for complete search history.

(56) References Cited

U.S. PATENT DOCUMENTS

| 6,930,943 | B2 | 8/2005 | Kim |
| 8,379,460 | B2 | 2/2013 | Jeong |
| 2006/0120196 | A1 | 6/2006 | Jeon et al. |
| 2013/0170274 | A1* | 7/2013 | Yu et al. ........................ 365/51 |
| 2014/0156910 | A1* | 6/2014 | Uttamchandani et al. .... 711/103 |

FOREIGN PATENT DOCUMENTS

| JP | 2009163585 | 7/2009 |
| KR | 1020000066268 | 11/2000 |
| KR | 1020030073160 | 9/2003 |

(Continued)

*Primary Examiner* — Fernando Hidalgo
(74) *Attorney, Agent, or Firm* — F. Chau & Associates, LLC

(57) ABSTRACT

A memory module is provided. A plurality of DRAMs is mounted on a PCB. At least one DRAM has an operating parameter different from other DRAMs according to a position where the at least one DRAM is mounted on the PCB.

11 Claims, 16 Drawing Sheets

(56) References Cited

FOREIGN PATENT DOCUMENTS

| KR | 1020040087152 | 10/2004 |
| KR | 1020050011823 | 1/2005 |
| KR | 1020060040194 | 5/2006 |
| KR | 1020060131512 | 12/2006 |
| KR | 1020110050780 | 5/2011 |
| WO | 2009089044 | 7/2009 |

* cited by examiner

MEMORY DEVICE, MEMORY MODULE INCLUDING THE MEMORY DEVICE, METHOD OF FABRICATING THE MEMORY MODULE, AND METHOD OF REPAIRING THE MEMORY MODULE

CROSS-REFERENCE TO RELATED APPLICATION

This application claims priority under 35 U.S.C. §119 to Korean Patent Application No. 10-2013-0101921 filed on Aug. 27, 2013, the disclosure of which is incorporated by reference herein in its entirety.

TECHNICAL FIELD

The present inventive concept relates to a memory device, a memory module including the memory device, a method of fabricating the memory module, and a method of repairing the memory module.

DISCUSSION OF RELATED ART

Dynamic random access memories (DRAMs) are characterized by an operating parameter. The operating parameter may include a refresh period, a timing parameter (or AC parameter) and/or an operating voltage condition (or DC parameter). When DRAMs are fabricated under an identical fabrication process, DRAMs may have a different operating parameter for various reasons including a process variation or a temperature variation, for example. DRAMs may be put together to form memory modules to increase memory space. Memory modules may be used in a server and/or a computer system requiring a large amount of DRAMs. The characteristics of DRAMs may change when DRAMs are subject to different temperature.

SUMMARY

According to an exemplary embodiment of the present inventive concept, a memory module is provided. A plurality of DRAMs is mounted on a PCB. At least one DRAM has an operating parameter different from other DRAMs according to a position where the at least one DRAM is mounted on the PCB.

According to an exemplary embodiment of the present inventive concept, a memory device is provided. The memory device includes a data storage unit, a fuse block, a refresh period controller, and a refresh controller. The fuse block is configured to store an adjustment value. The refresh period controller is configured to adjust a refresh period based on the adjustment value. The refresh controller is configured to perform a refresh operation on the data storage unit based on the adjusted refresh period.

According to an exemplary embodiment of the present inventive concept, a memory module is provided. The memory module includes a register, a first DRAM and a second DRAM. A register is disposed at a center region. A first DRAM is disposed at a first distance from the register. The first DRAM has a first operating parameter. A second DRAM is disposed at a second distance from the register. The second DRAM has a second operating parameter. The first operating parameter is different from the second operating parameter.

According to an exemplary embodiment of the present inventive concept, a method of repairing a memory module including a plurality of DRAMs is provided. The memory module is tested. If the memory module passes the testing, at least one DRAM is adjusted to have a refresh period or a control parameter according to a position where the at least one DRAM is mounted on the memory module.

According to an exemplary embodiment of the present inventive concept, a method of fabricating a memory module is provided. A register is mounted on a PCB. A DRAM is tested. The tested DRAM is mounted at a relative position from the register on the PCB. The relative position is determined based on the testing result.

BRIEF DESCRIPTION OF THE DRAWINGS

These and other features of the inventive concepts will become more apparent by describing in detail exemplary embodiments thereof with reference to the accompanying drawings of which.

DETAILED DESCRIPTION OF EXEMPLARY EMBODIMENTS

Figure 1:
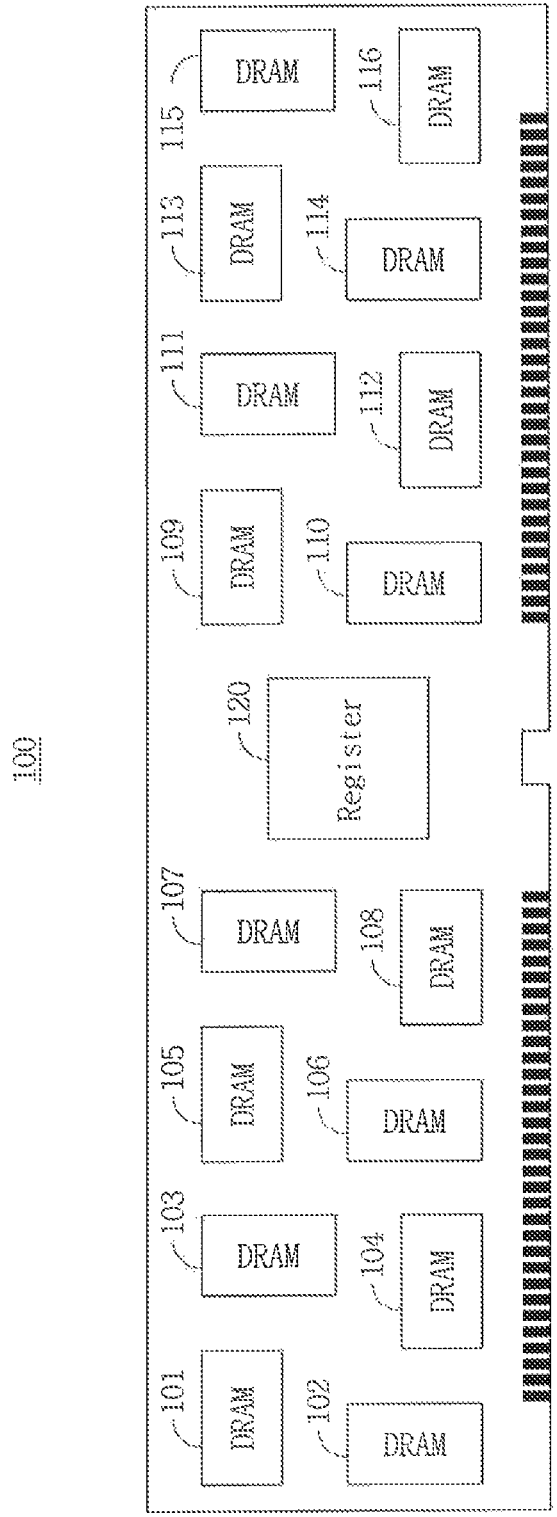
FIG. 1 is a block diagram of a memory module according to an exemplary embodiment of the inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is a block diagram of a memory module according to an exemplary embodiment of the inventive concept.

Referring to FIG. 1, the memory module 100 includes first through sixteenth dynamic random access memories (DRAMs) 101 to 116, and a register 120. Each of the first through sixteenth DRAM 101 to 116 may be 4 bits wide in a read or write operation. The DRAMs 101 to 116 may be configured such that the memory module 100 is 64 bits wide. The inventive concept is not limited thereto, and the memory module may be configured in various ways using DRAMs having various data widths.

The register 120 receives a command and an address signal from a host (i.e., a memory controller). The register 120 transmits the command to each of the first through sixteenth DRAMs 101 to 116. The register 120 may re-drive the command and the address signal. The register 120 may include a buffer chip or an interface chip, for example.

The memory module 100 having the register 120 may be referred to as a registered dual in line memory module (RDIMM) or a load-reduced dual in line memory module (LRDIMM). Such memory module 100 may be used for a server system. The application of such memory module 100 is not limited to a server system, and the memory module 100 may be employed in a computer system requiring data storage.

The register 120 may dissipate heat such that a temperature increase within a system employing the memory module 100 may affect leakage current of the DRAMs 101 to 116 of the memory module 100. Commands, address signals and/or data input/outputs may be buffered and re-driven to each of DRAMs 101 to 116. As such, the register 120 may have the highest temperature in the memory module 100. Accordingly, heat dissipated from the register 120 may affect leakage current of DRAMs (e.g., the seventh through tenth DRAMs 107 to 110) disposed in the vicinity of the register 120, and the temperature of the DRAMs disposed in the vicinity of the register 120 may be relatively high.

For example, the temperature in a region where the seventh through tenth DRAMs 107 to 110 are mounted may be higher than the temperature in a region where the first DRAM 101 is mounted. The first DRAM 101 is disposed farthest away from the register 120 or in the peripheral region of the memory module 100. Depending on the temperature, the operating parameters of the DRAMs 101 to 116 may be changed. For example, the operating parameters may include a refresh period tREF of a DRAM. The change in a refresh period tREF with respect to temperature will be described with reference to FIG. 2.

When the memory module 100 operates, the temperature of the first through sixteenth DRAMs 101 to 116 may be increased. The temperature of the seventh through tenth DRAMs 107 to 110 disposed in the center of the memory module 100 may be higher than the temperature of the first and second DRAMs 101 and 102 disposed in the peripheral region of the memory module 100. This temperature change may affect each of the first through sixteenth DRAMs 101 to 116 of the memory module 100 in light of their operating parameters.

Figure 2:
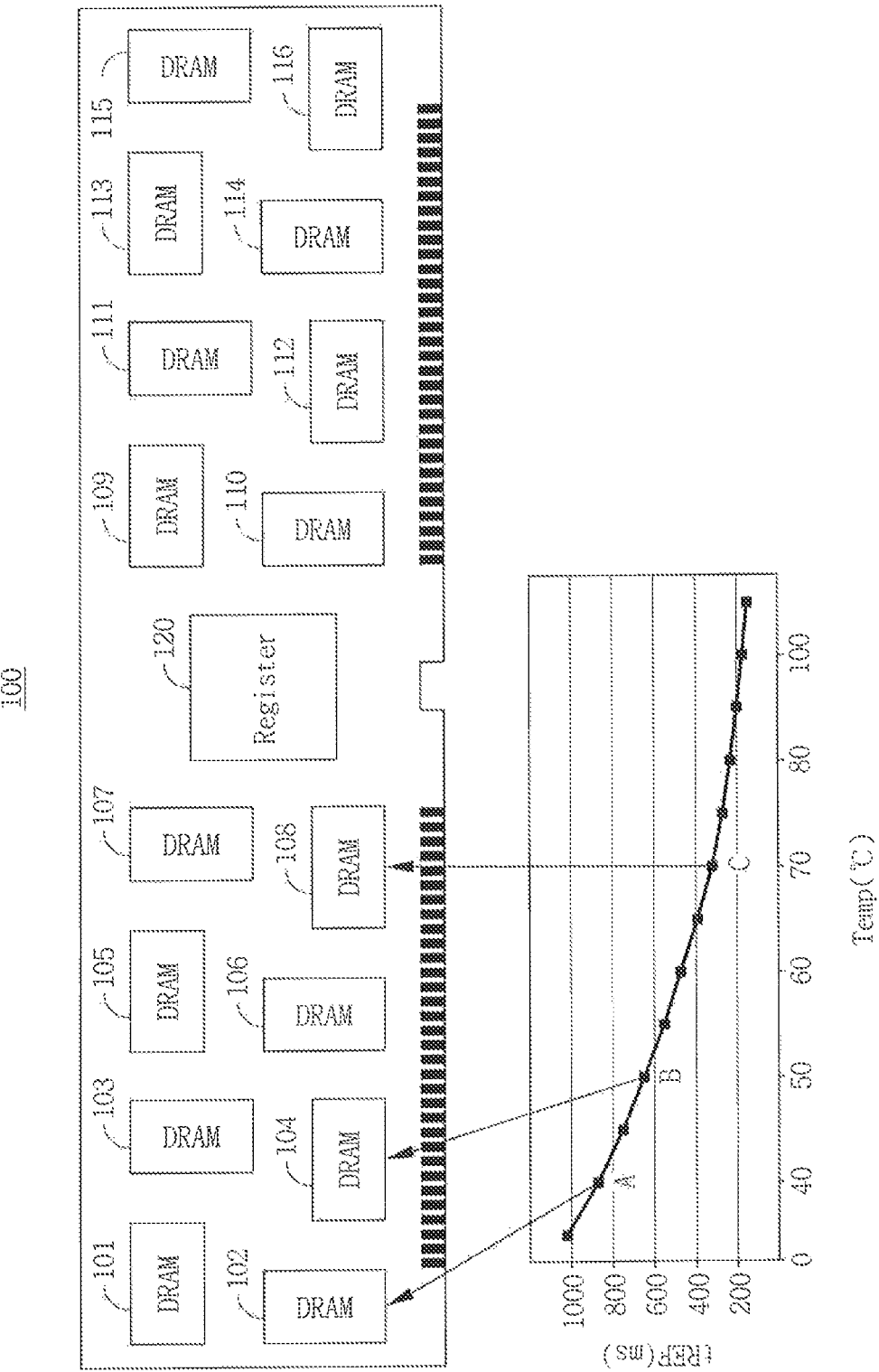
FIG. 2 is a graph illustrating refresh period changes of the memory module of FIG. 1 with respect to temperature.

FIG. 2 is a graph illustrating refresh period changes of the memory module in FIG. 1 with respect to temperature.

Referring to FIGS. 1 and 2, the abscissa of the graph denotes temperature of the memory module 100, and the ordinate of the graph denotes a refresh period tREF of a DRAM of the memory module 100.

The DRAMs 101 to 116 may include a capacitor as a memory cell to store data. However, charges stored in the capacitor may be discharged due to leakage current. Accordingly, the memory cell is periodically is refreshed at a predetermined time period before the memory cell loses its data.

The predetermined time at which a refresh operation is repeated may be referred to as a refresh period tREF. The leakage current of a capacitor may be increased as the temperature of a DRAM is increased. Accordingly, the capacitor that is subject to higher temperature need to be more frequently refreshed to retain its charges. For example, the refresh period tREF of a DRAM may be shortened.

As shown on the graph of FIG. 2, the refresh period tREF is shortened as the temperature of the module 100 is increased. Dot A represents a relationship of temperature and a refresh period tREF for the DRAM 102. Dot B represents a relationship of temperature and a refresh period tREF for the DRAM 104. Dot C represents a relationship of temperature and a refresh period tREF for the DRAM 108. A dot A refers to a refresh period relative to a temperature of the second DRAM 102. As a DRAM is closer to the register 120, the temperature increases and the refresh period tREF inversely is reduced. Accordingly, the refresh characteristics of a DRAM may be worsen as the DRAM is closer to the register 120.

For example, the temperature of the eighth DRAM 108 disposed in the center of the memory module 100 is higher than the temperature of the second DRAM 102 disposed in the peripheral region of the memory module 100. Accordingly, the refresh period tREF of the eighth DRAM 108 is shorter than the refresh period tREF of the second DRAM 102. The eighth DRAM 108 does not satisfy Joint Electronic Device Engineering Council (JEDEC) standards, and thus the memory module 100 may include a defective DRAM. In that case, the memory module 100 may be classified as a failure.

According to an exemplary embodiment of the inventive concept, the refresh period of a DRAM that was initially or previously set may be adjusted depending on the temperature of the DRAMs. Also, A time point of an AC parameter or an internal voltage of a DC parameter of the first through sixteenth DRAMs 101 to 116 may adjusted depending on the temperature of the DRAMs. Accordingly, when the memory module includes a defective DRAM, such defective DRAM may be cured by adjusting an operating parameter.

Under the JEDEC standards or its equivalent operation specification, an automatic refresh operation and/or a self-refresh operation may be performed to a DRAM. In the case of an automatic refresh operation, a DRAM receives a refresh control signal from an external memory controller at a predetermined refresh period, and perform a refresh operation in response to the refresh control signal. In the case of a self-refresh operation, a DRAM may perform a refresh operation in response to a refresh control signal that is internally generated at a predetermined refresh period.

Figure 3:
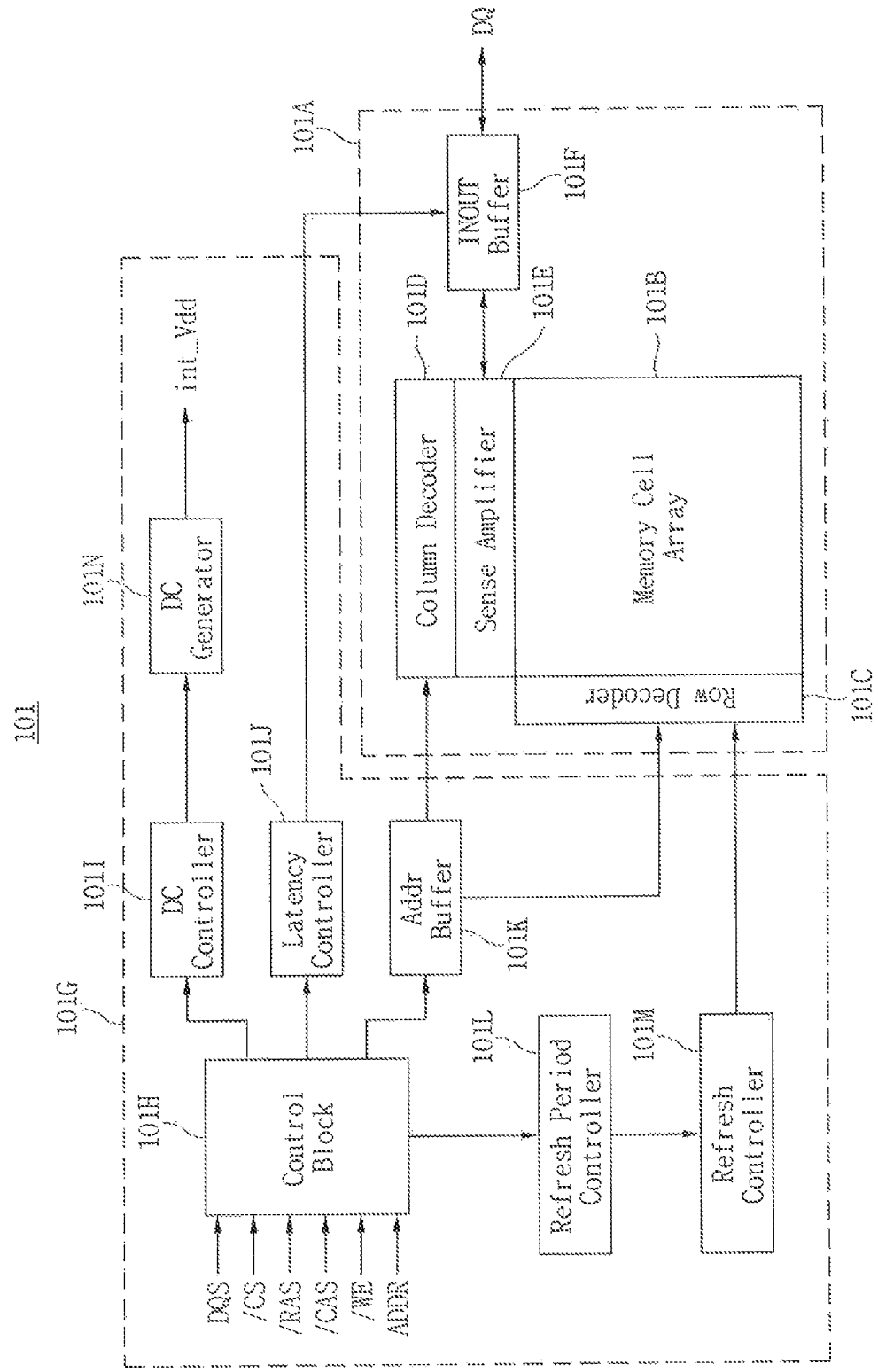
FIG. 3 is a block diagram of a DRAM mounted on the memory module of FIG. 1 according to an exemplary embodiment of the inventive concept.

FIG. 3 is a block diagram of a DRAM mounted on the memory module of FIG. 1 according to an exemplary embodiment of the inventive concept.

Referring to FIGS. 1 and 3, the first DRAM 101 includes a data storage unit 101A and a storage controller 101G.

The data storage unit 101A includes a memory cell array 101B, a row decoder 101C configured to provide a row address to the memory cell array 101B, a column decoder 101D configured to provide a column address to the memory cell array 101B, a sense amplifier 101E configured to sense data of the memory cell array 101B, and an input/output (I/O) buffer 101F configured to output data from the sense amplifier 101E or transmit data to the sense amplifier 101E.

The memory cell array 101B includes a plurality of memory cells that are two-dimensionally disposed. Each of the plurality of memory cells is selected by a word line, and data stored in each of the memory cells is transmitted to the sense amplifier 101E through a bit line.

The row decoder 101C receives a row address and selects at least one of a plurality of word lines in the memory cell array 101B.

The column decoder 101D receives a column address and selects at least one pair of bit lines out of a plurality of pairs of bit lines in the memory cell array 101B.

The sense amplifier 101E detects data stored in a memory cell corresponding to a row selected out of the memory cell array 101B, through each of the bit lines. The sense amplifier 101E refreshes or re-writes data in a memory cell corresponding to a selected row.

The storage controller 101G includes a control block 101H, a direct-current (DC) controller 101I, a latency controller 101J, an address buffer 101K, a refresh period controller 101L, a refresh controller 101M, and a DC generator 101N.

The control block 101H controls the DC controller 101I, the latency controller 101J, the address buffer 101K, and the refresh period controller 101L.

The control block 101H receives control signals ADDR, /WE, /CAS, /RAS, /CS, DQ, and DQS from a host (e.g., a memory controller (not shown)). The control signal ADDR is an address signal including a row address and a column address. The control signal /WE corresponds to a signal required to enable a write operation. The control signal /CAS corresponds to a column address strobe signal. The control signal /RAS corresponds to a row address strobe signal. The control signal /CS corresponds to a signal required to select a DRAM. The data queue signal DQ corresponds to a signal including data. The control signal DQS corresponds to a signal required to strobe a data queue (DQ).

The DC controller 101I controls the DC generator 101N configured to generate an internal voltage to be supplied to the data storage unit 101A. The DC controller 101I may adjust the level of the internal voltage. The internal voltage may include a bit line voltage VBL, a body bias voltage VBB, and a cell plate voltage VCP.

For example, the DC generator 101N generates the bit line voltage VBL, the body bias voltage VBB, and the cell plate voltage VCP. The DC controller 101I may control the DC generator 101N so that the voltage levels of the bit line voltage VBL, the body bias voltage VBB, and the cell plate voltage VCP that are initially and/or previously set are adjusted. The bit line voltage VBL, the body bias voltage VBB, and the cell plate voltage VCP will be described with reference to FIGS. 5A and 5C.

The control block 101H controls the latency controller 101J so that the latency of the DRAM 101 initially and/or previously set is adjusted. The latency controller 101J adjusts AC parameters under the control of the control block 101H. The AC parameters may include a RAS-to-CAS delay time (tRCD) and a write recovery time (tWR).

The latency controller 101J receives a CAS latency from the control block 101H. The latency controller 101J sets the I/O buffer 101F using the CAS latency so that the I/O buffer 101F outputs data according to the CAS latency. In addition, the latency controller 101I sets the I/O buffer 101F using the CAS latency so that the I/O buffer 101F transmits data to the memory cell array 101B through the sense amplifier 101E in satisfaction of the CAS latency.

For example, the latency controller 101J controls the I/O buffer 101F and thus adjusts a tRCD or a tWR. Also, the latency controller 101J controls the I/O buffer 101F and thus adjusts setup and hold time margins of a DQ signal or a DQS signal.

The AC parameters, such as tRCD and tWR, may be specified by JEDEC standards or their equivalent operation specification. The memory controller operates the memory module 100 using the AC parameters.

When the first DRAM 101 receives a command transmitted from the memory controller, the first DRAM 101 may adjust a time point at which a circuit related with the command operates. For example, the AC parameters may be controlled by controlling the time point at which the circuit operates.

The AC parameter tRCD will be described with reference to FIGS. 4A and 4B. The AC parameter tWR will be described with reference to FIGS. 4C and 4D.

The address buffer 101K receives an address signal ADDR from the control block 101H. The address buffer 101K transmits a row address signal to the row decoder 101C, and transmits a column address signal to the column decoder 101D.

The refresh period controller 101L adjusts a refresh period of the first memory module 101 using the refresh controller 101M. The data storage unit 101A is refreshed at the time period of the adjusted refresh period. For example, during a refresh operation, the refresh period controller 101L may control the refresh controller 101M to adjust the number of word lines of a memory cell array 101B selected for a refresh operation.

For example, when the refresh period controller 101L controls the refresh controller 101M to increase the number of word lines of the memory cell array 101B from 2 to 4, the refresh period of the first DRAM 101 may be reduced by half.

Each of the second through sixteenth DRAMs 102 to 116 may include substantially the same configuration as the first DRAM 101.

Figure 4A:
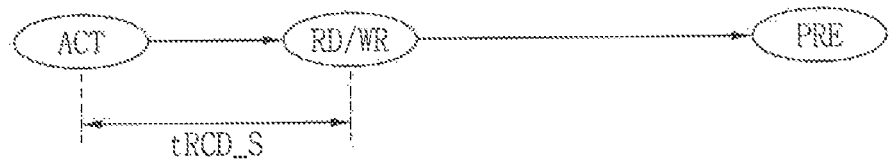
FIGS. 4A and 4B illustrate a RAS-to-CAS delay time (tRCD) according to an exemplary embodiment of the inventive concept.
Figure 4B:
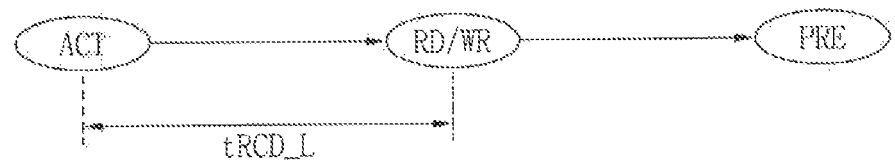

FIGS. 4A and 4B illustrate a tRCD according to an exemplary embodiment of the inventive concept.

Referring to FIGS. 4A and 4B, an active operation mode may be referred to as an operation mode in response to an active command ACT. In response to the active command ACT, a word line is selected and the selected word line is enabled so that a read or write operation is performed.

A read or write operation mode may be referred to as a mode in which an operation of writing data in a memory cell or reading stored data is performed in response to a read or write command (RD/WR).

A precharge operation mode may be referred to as a mode in which an operation of precharging a voltage level of a bit line connected to a memory cell to a predetermined level is performed in response to a precharge command PRE.

The AC parameter tRCD corresponds to the minimum time for which data is read from or written into the corresponding bank selected in response to the active command ACT. For example, tRCD is the time (or the number of clock cycle) taken between issuing of the active command and the read or write (RD/WD) command.

Subsequently, referring to FIGS. 3, 4A, and 4B, the latency controller 101J controls the I/O buffer 101F and adjusts a time point of tRCD. For example, the latency controller 101J may control the I/O buffer 101F to generate a short time point of tRCD_S or a long time point of tRCD_L.

For example, when a long time point of tRCD_L is applied, a read or write command (RD/WD) is issued later than the specified tRCD. As such, when a sense amplifier 101E has a small sensing margin a memory cell, the long time point of tRCD_L may increase the sensing margin so that the sense amplifier 101E reads a data from the memory cell.

Figure 4C:
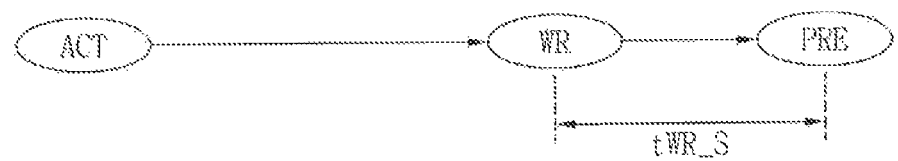
FIGS. 4C and 4D illustrate a write recovery time (tWR) according to an exemplary embodiment of the inventive concept.
Figure 4D:
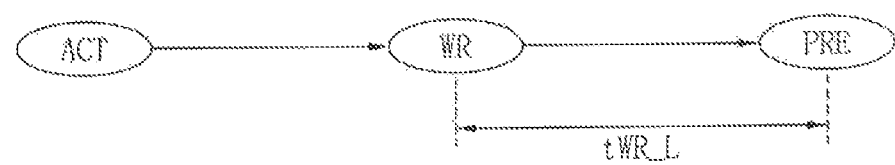

FIGS. 4C and 4D illustrate tWR according to an exemplary embodiment of the inventive concept.

The AC parameter tWR corresponds to the shortest possible time taken between writing data and issuing the precharge command PRE. The AC parameter tWR corresponds to a necessary, minimum time to secure a read or write operation before issuing a precharge command PRE.

Referring to FIGS. 3, 4C, and 4D, the latency controller 101J controls the I/O buffer 101F and adjusts a time point of tWR. For example, the latency controller 101J may control the I/O buffer 101F to generate a short time point of tWR_S or a long time point of tWR_L.

The characteristics of tWR may be degraded as temperature drops. Accordingly, as the temperature of the memory module 100 is decreased, tWR_L may be used in the memory module 100 to secure a read or write operation.

Figure 5A:
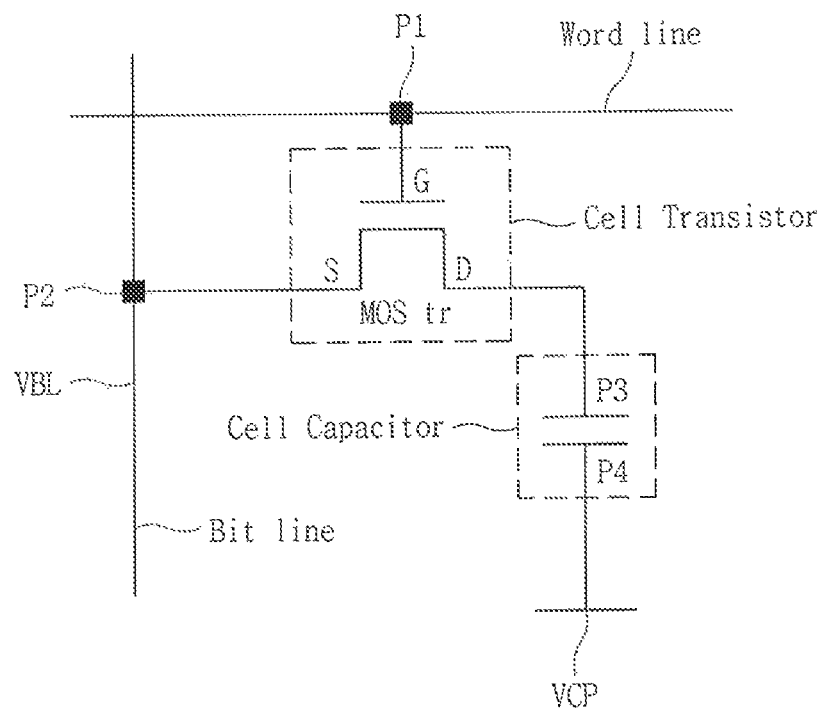
FIG. 5A illustrates a bit line voltage and a cell plate voltage according to an exemplary embodiment of the inventive concept.
Figure 5B:
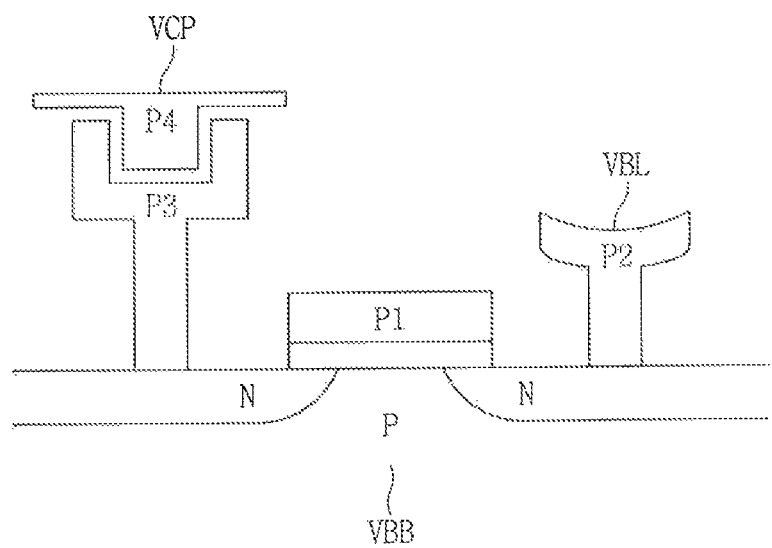
FIG. 5B illustrates a body bias voltage according to an exemplary embodiment of the inventive concept.

FIGS. 5A and 5B illustrate one of memory cells disposed in the memory cell array 101B of FIG. 3. For example, FIG. 5A is a circuit diagram of the memory cell, and FIG. 5B is a cross-sectional view of the memory cell of FIG. 5A.

Referring to FIGS. 5A and 5B, the memory cell includes a single cell capacitor and a single cell transistor to store 1-bit data. A gate of the cell transistor is connected to a word line, a source of the cell transistor is connected to a bit line, and a drain of the cell transistor is connected to the cell capacitor.

A bit line voltage VBL corresponds to a voltage applied to the bit line, and a body bias voltage VBB corresponds to a bias voltage applied to a body of the transistor.

The cell capacitor includes a storage capacitor configured to store the 1-bit data. The storage capacitor includes a storage electrode connected to the bit line, a dielectric layer, and a plate electrode. A cell plate voltage (VCP) corresponds to a voltage applied to a plate electrode of the storage capacitor. Also, the DRAM may include various DC parameters necessary to operate the memory cell. Accordingly, various characteristics of the DRAM may be controlled by adjusting the DC parameters of the DRAM.

Figure 5C:
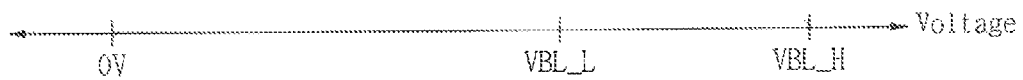
FIGS. 5C through 5E illustrate a bit line voltage, a body bias voltage, and a cell plate voltage generated using the DC generator of FIG. 3 according to an exemplary embodiment of the inventive concept.
Figure 5D:
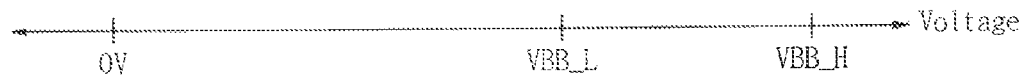
Figure 5E:
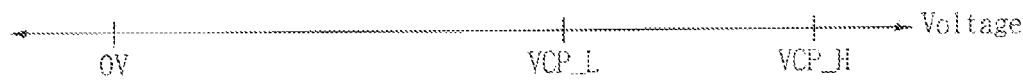

FIGS. 5C through 5E illustrate a bit line voltage VBL, a body bias voltage VBB, and a cell plate voltage VCP generated by the DC generator 101N of FIG. 3 according to an exemplary embodiment of the inventive concept.

Referring to FIGS. 1, 3, and 5A through 5C, the DC generator 101N generates the bit line voltage VBL, the body bias voltage VBB, and the cell plate voltage VCP. For example, the DC generator 101N generates a high bit line voltage VBL_H and a low bit line voltage VBL_L in response to the control of the DC controller 101. Similarly, the DC generator 101N generates a high body bias voltage VBB_H and a low body bias voltage VBB_L in response to the control of the DC controller 101. Also, the DC generator 101N generates a high cell plate voltage VCP_H and a low cell plate voltage VCP_L in response to the control of the DC controller 101.

For example, it is assumed that the seventh DRAM 107 of the memory module 100 includes a failed memory cell storing data "1" due to cell leakage under an operation condition. For the failed memory cell, a low bit line voltage VBL_L and a low body bias voltage VBB_L are respectively applied to the failed memory cell. The low bit line voltage VBL_L and the low body bias voltage VBB_L are respectively applied to the failed memory cell instead of the bit line voltage VBL and the body bias voltage VBB. In this case, the cell leakage of the failed memory cell may be reduced such that the failed memory cell may be recovered under the same operation condition. Accordingly, the failure in the seventh DRAM may be prevented by adjusting DC parameters.

Figure 6:
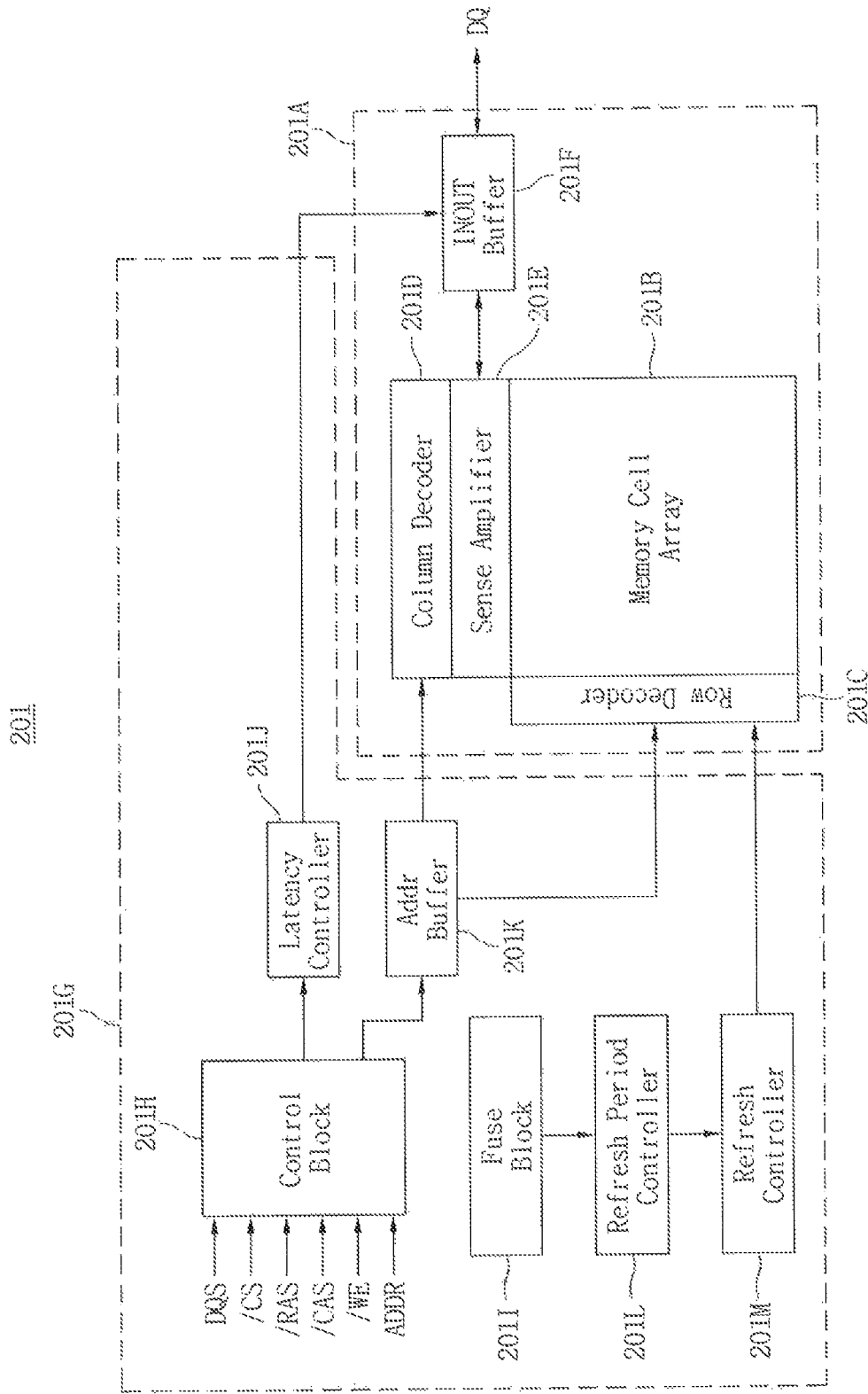
FIG. 6 is a block diagram of a DRAM according to an exemplary embodiment of the inventive concept.

FIG. 6 is a block diagram of a DRAM 201 according to an exemplary second embodiment of the inventive concept.

Referring to FIG. 6, the DRAM 201 includes a data storage unit 201A and a storage controller 201G.

The data storage unit 201A includes a memory cell array 201B, a row decoder 201C configured to provide a row address to the memory cell array 201B, a column decoder 201D configured to provide a column address to the memory cell array 201B, a sense amplifier 201E configured to sense data of the memory cell array 201B, and an I/O buffer 201F configured to output data from the sense amplifier 201E, or transmit data to the sense amplifier 201E.

The data storage unit 201A may have substantially the same configuration as the data storage unit 101A of FIG. 3.

The storage controller 201G includes a control block 201H, a fuse block 201I, a latency controller 201J, an address buffer 201K, a refresh period controller 201L, and a refresh controller 201M.

The control block 201H controls the latency controller 201J and the address buffer 201K.

The control block 201H receives control signals ADDR, /WE, /CAS, /RAS, /CS, DQ, and DQS from a host (e.g., a memory controller (not shown)).

The latency controller 201J receives a CAS latency from the control block 201H. The latency controller 201J may transmit a CAS latency to the I/O buffer 201F so that the I/O buffer 101F may output data at an appropriate time point.

The address buffer 201K receives an address signal ADDR from the control block 201H. The address buffer 201K transmits a row address signal to the row decoder 201C, and transmits a column address signal to the column decoder 201D.

The fuse block 201I stores a refresh period setting value. The fuse block 201I may include an electrical fuse, an anti-fuse, or a laser fuse.

The refresh period controller 201L controls the refresh controller 201M using the refresh period setting value. The refresh controller 201M performs a refresh operation on the data storage unit 201A under the control of the refresh period controller 201L. For example, the refresh period controller 201L sets the number of word lines of a memory cell array 201B for a refresh operation using the refresh period setting value. Accordingly, the refresh period controller 201L may adjust a refresh period.

Figure 7:
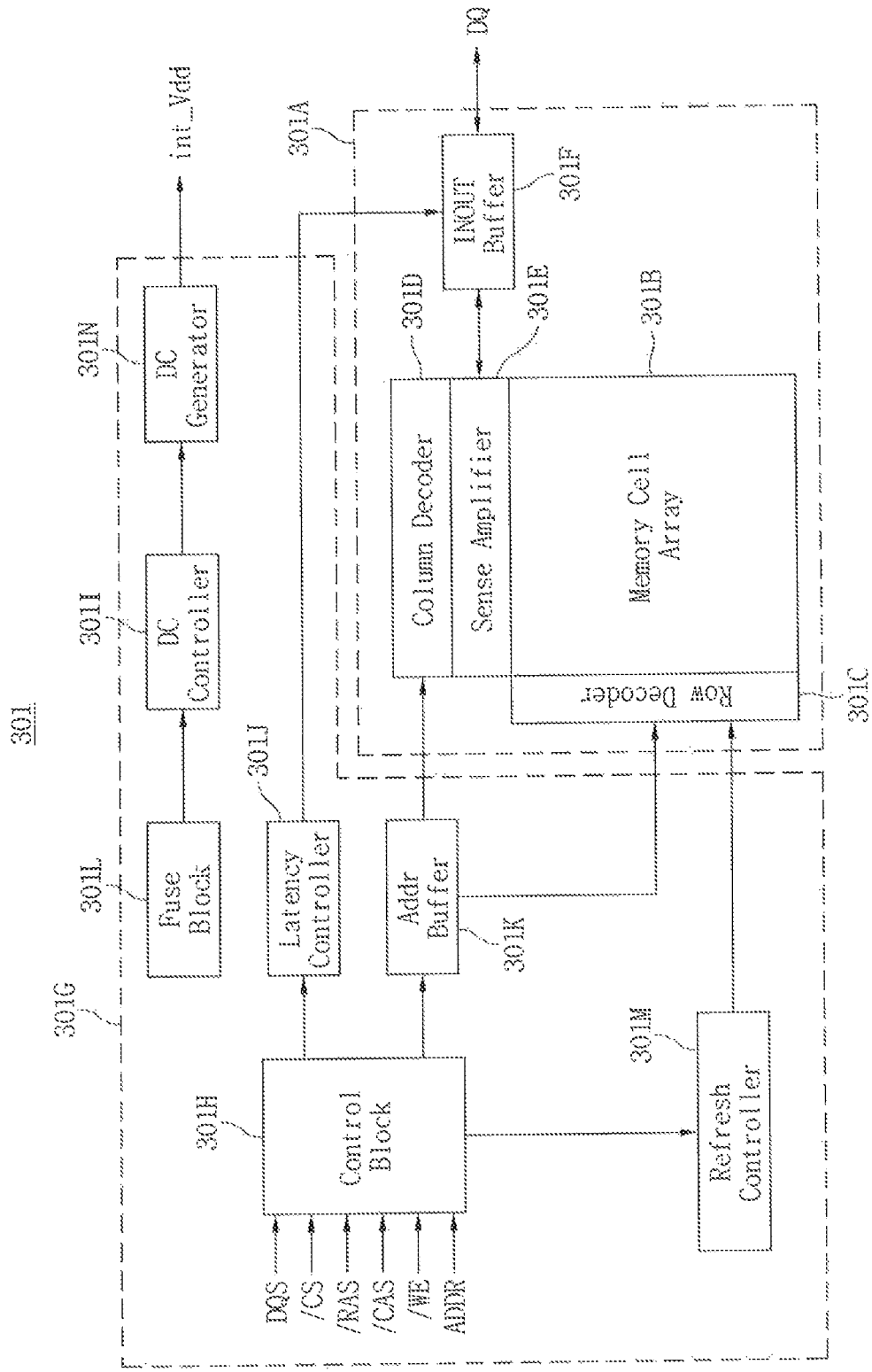
FIG. 7 is a block diagram of a DRAM according to an exemplary embodiment of the inventive concept.

FIG. 7 is a block diagram of a DRAM according to an exemplary embodiment of the inventive concept.

Referring to FIG. 7, the DRAM 301 includes a data storage unit 301A and a storage controller 301G.

The data storage unit 301A includes a memory cell array 301B, a row decoder 301C configured to provide a row address to the memory cell array 301B, a column decoder 301D configured to provide a column address to the memory cell array 301B, a sense amplifier 301E configured to sense data of the memory cell array 301B, and an I/O buffer 301F configured to output data from the sense amplifier 301E, or transmit data to the sense amplifier 301E.

The data storage unit 301A may have substantially the same configuration as the data storage unit 101A of FIG. 3.

The storage controller 301G includes a control block 301I, a DC controller 301I, a latency controller 301J, an address buffer 301K, a fuse block 301L, a refresh controller 301M, and a DC generator 101N.

The control block 101H controls the latency controller 101J, the address buffer 101K, and the refresh controller 301M.

The control block 101H receives control signals ADDR, /WE, /CAS, /RAS, /CS, DQ, and DQS from a host (e.g., a memory controller (not shown)).

The fuse block 301L stores a DC setting value. The fuse block 201I may include an electrical fuse, an anti-fuse, or a laser fuse.

The DC controller 301I controls a DC generator 301N based on the DC setting value. The DC generator 301N provides various internal voltages to the data storage unit 301 under the control of the DC controller 301I. For example, the DC controller 101I may adjust DC parameters. For example, the various internal voltages may include a bit line voltage VBL, a body bias voltage VBB, and/or a cell plate voltage VCP. The DC controller 101I adjusts the voltage levels of the bit line voltage VBL, the body bias voltage VBB, and the cell plate voltage VCP under the control of the DC generator 101N.

The latency controller 301J receives a CAS latency from the control block 301H. The latency controller 301J may transmit a CAS latency to the I/O buffer 301F such that the I/O buffer 301F may output data at an appropriate time point.

The address buffer 301K receives an address signal ADDR from the control block 301H. The address buffer 301K transmits a row address signal to the row decoder 301C, and transmits a column address signal to the column decoder 301D.

Figure 8:
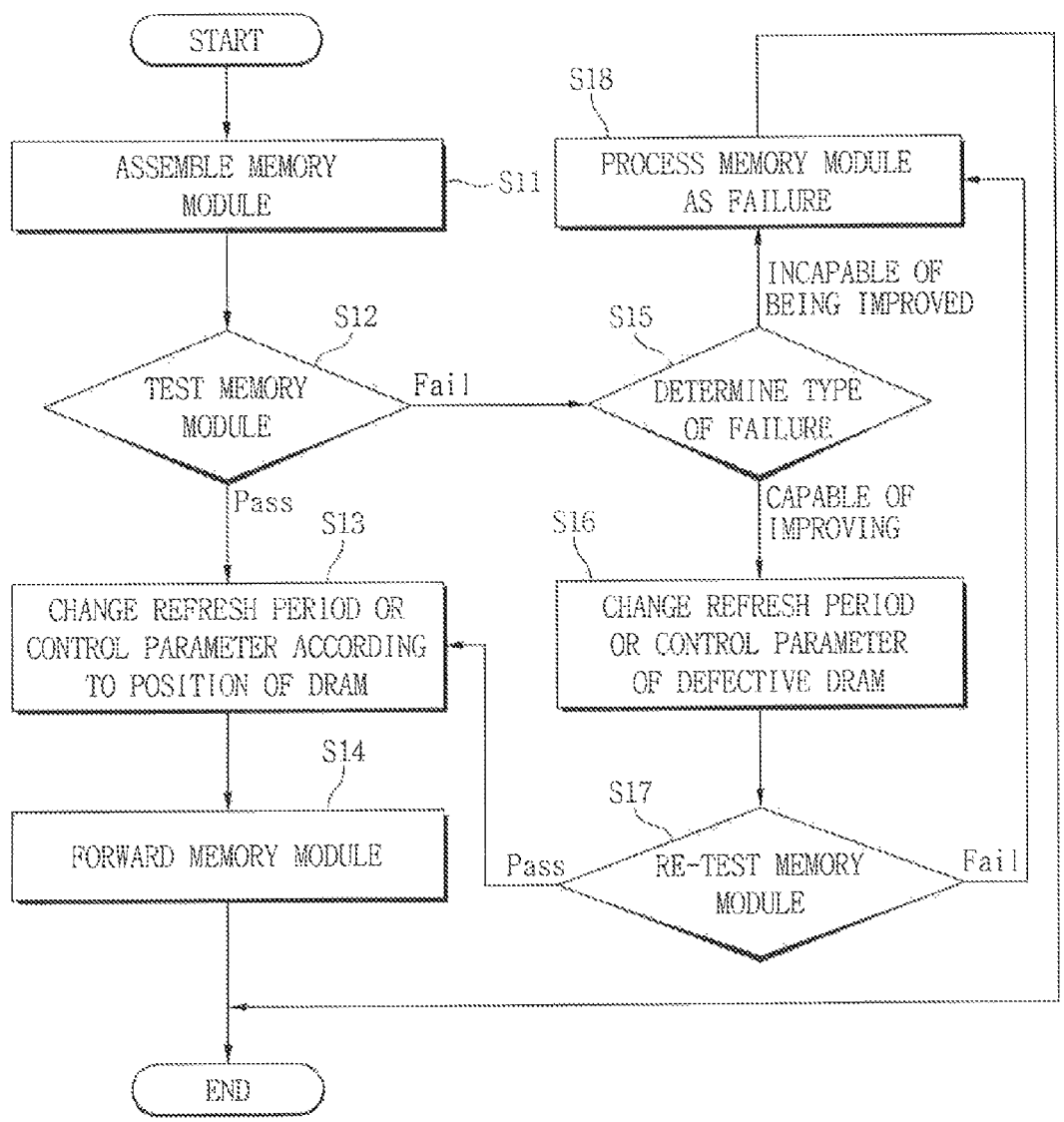
FIG. 8 is a flowchart illustrating a method of repairing a memory module according to an exemplary embodiment of the inventive concept.

FIG. 8 is a flowchart illustrating a method of repairing a memory module according to an exemplary embodiment of the inventive concept.

Referring to FIGS. 1 and 8, a failure may occur in the memory module 100 in a mass production operation. For instance, errors may occur during a refresh operation of a DRAM, which may be sensitive to heat, out of a plurality of DRAMs included in the memory module 100. In this case, defective DRAMs may be cured using an exemplary embodiment of the inventive concept.

In operation S11, the memory module 100 is assembled in the mass production operation.

In operation S12, the memory module 100 is tested. The memory module 100 may be passed or failed based on the testing results. When the memory module 100 is passed, operations S13 and S14 are executed; otherwise operation S15 is executed.

In operations S13 and S14, the memory module 100 may change a refresh period or a control parameter according to a position at which each of the plurality of DRAMs is mounted in the memory module 100 in order to prevent occurrence of failures due to generation of heat. For instance, a refresh period of a DRAM mounted in the center of the memory module 100 may be set to be shorter than a period of a DRAM mounted in a peripheral region thereof.

In operation S15, the type of failure in the memory module 100 is determined. If the type of failure is curable, operations S16 and S17 are executed. For example, if the type of failure relates to memory cell leakage current, such failure may be cured by reducing such memory cell leakage current. The memory cell leakage current may be suppressed by changing a refresh period, AC parameters and/or DC parameters. Single bit failure, which may be referred to a soft error, may be occurred due to memory leakage current from a single memory cell. When the memory module 100 is determined to have the failure type of a single bit failure only, defective memory cells may be cured. Other types of failure, which may be referred to as a hard error, may be caused by physical shortage among metal wires and/or memory cells, for example. Such hard error may also be caused by metal wires not being connected to other conductive layers or patterns. Such hard error may have failure patterns in a row and/or column or failure patterns of at least two adjacent memory cells.

When the memory module 100 is determined as not curable, operation S18 is executed.

In operation S16, a refresh period and/or an AC parameter of a defective DRAM are changed according to its relative position with respect to the register on the memory module 100. Such changes in the refresh period and/or the AC parameter of the defective DRAM may remove soft errors from the defective DRAM and thus it is cured.

In operation S17, the memory module 100 is re-tested. The memory module 100 is passed or failed based on the re-testing results. When the memory module 100 is passed, operation S13 is executed; otherwise operation S18 is executed.

In operation S18, the memory module 100 is finally determined as a failure.

Figure 9:
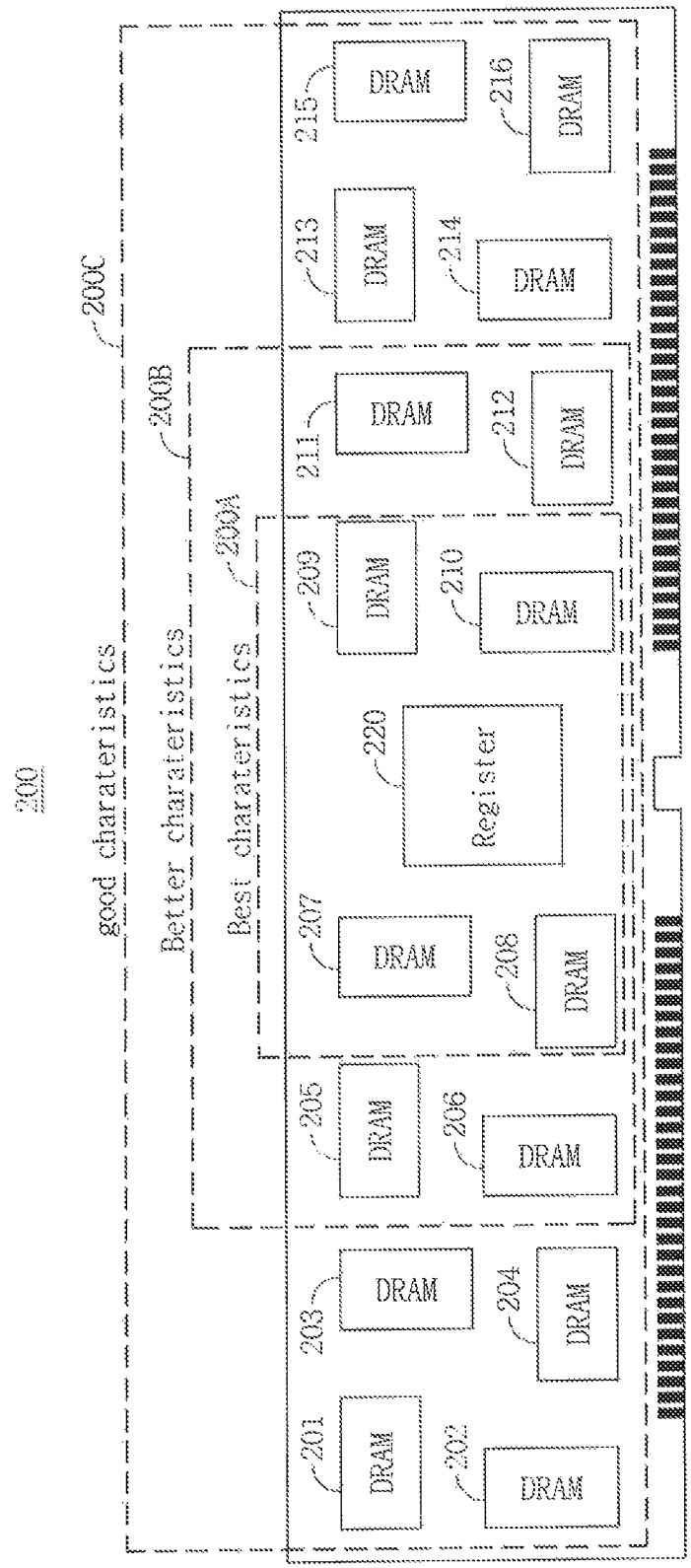
FIG. 9 illustrates a memory module according to an exemplary embodiment of the inventive concept.
Figure 10:
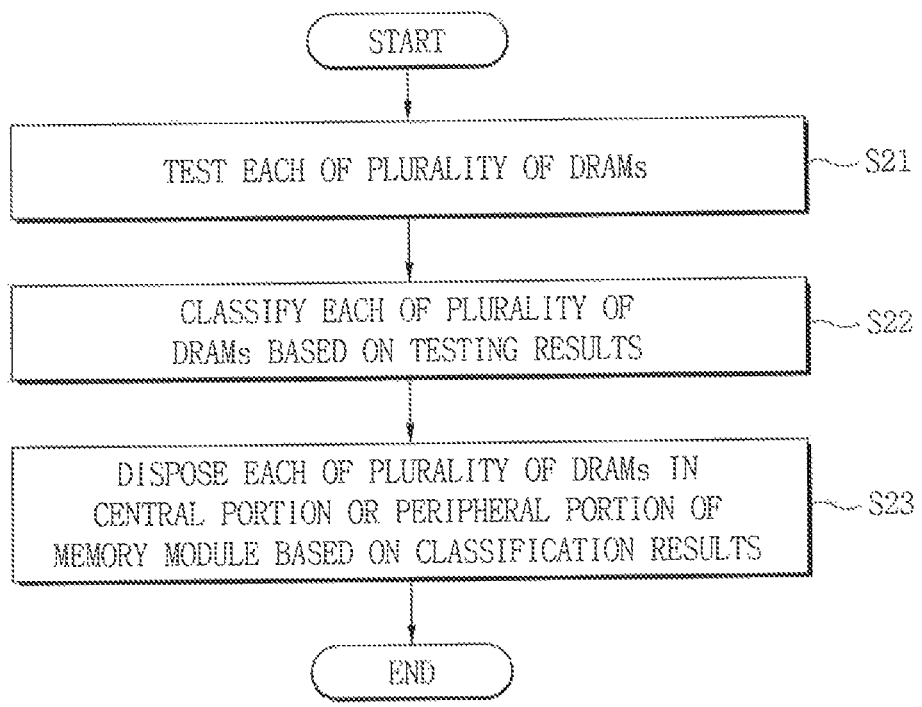
FIG. 10 is a flowchart illustrating a method of fabricating the memory module of FIG. 9 according to an exemplary embodiment of the inventive concept.

FIG. 9 illustrates a memory module according to an exemplary embodiment of the inventive concept, and FIG. 10 is a flowchart illustrating a method of fabricating the memory module of FIG. 9 according to an exemplary embodiment of the inventive concept.

Referring to FIG. 9, the memory module 200 includes first through sixteenth DRAMs 201 to 216, and a register 220. Each of the first through sixteenth DRAMs 201 to 216 is 4 bits wide in a read or write operation. The DRAMs 201 to 216 may be configured such that the memory module 200 is 64 bits wide. The inventive concept is not limited thereto, and the memory module 200 may be configured in various ways using DRAMs having various data widths.

The register 220 receives a command and an address signal from a host. The register 220 transmits the command and the address signal to each of the first through sixteenth DRAMs 201 to 216. The register 220 may re-drive the command and the address signal to the first through sixteenth DRAMs 201 to 216. The register 220 may include a buffer chip or an interface chip, for example.

The register may dissipate heat such that a temperature increase within a system employing the memory module 200 may affect the amount of leakage current of the DRAMs 201 to 216 of the memory module 200. Commands, address signals and/or data input/output may be buffered and re-driven to each of the DRAMS 201 to 216. The register 220 may have the highest temperature on the memory module 200. Accordingly, the heat dissipated from the register 220 may affect leakage current of DRAMs (e.g., the seventh through tenth DRAMs 107 to 110) disposed around the register 220, and temperatures of the DRAMs disposed around the register 220 may be relatively high.

For example, the temperature in a region where the seventh through tenth DRAMs 207 to 210 are mounted may be higher than the temperature in a region where the first DRAM 201 is mounted. The first DRAM 201 is disposed farthest away from the register 220 or in a peripheral portion 200C.

In operation S21, a tester tests each of a plurality of DRAMs.

In operation S22, each of the plurality of DRAMs is classified based on the testing results. For example, when a DRAM is determined as having a good characteristics, the DRAM is classified as bin 3, for example. When a DRAM is determined as having a better characteristics, the DRAM is classified as bin 2, for example. When a DRAM is determined as having a best characteristics, the DRAM is classified as bin 1, for example. The characteristics may include an AC parameter relating to a retention time of a memory cell. For the convenience of a description, the characteristics is classified into three bins of bin 1 to bin 3. However, the inventive concept is not limited thereto.

In operation S23, each of the plurality of DRAMs is mounted on the memory module 200 based on the classification results.

For example, a DRAM classified as bin 1 is mounted on a region close to the register 220 or the central region 200A of the memory module 200. A DRAM classified as bin 3 is mounted on a region 200B of the memory module 200. A DRAM classified as bin 3 is mounted on the peripheral region 200C of the memory module 200.

Figure 11:
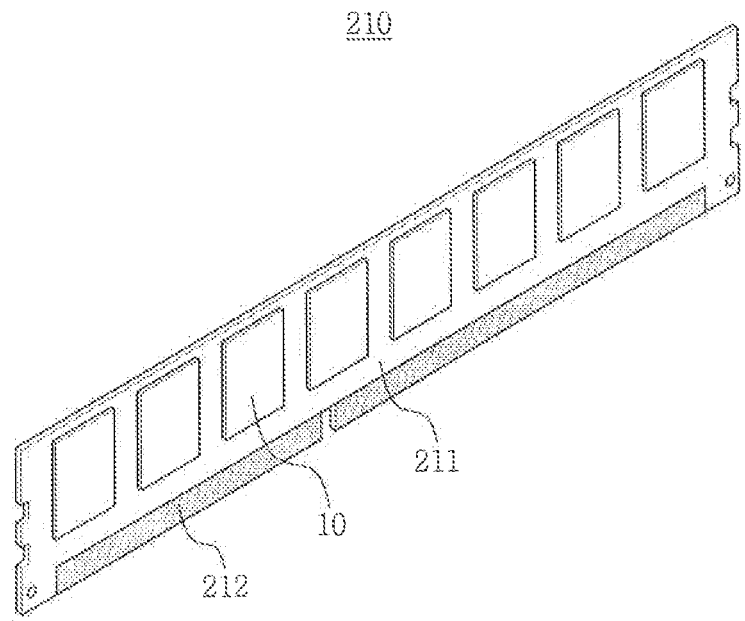
FIGS. 11 through 13 are diagrams of memory modules including the semiconductor memory device of FIG. 1 according to an exemplary embodiment of the inventive concept.
Figure 12:
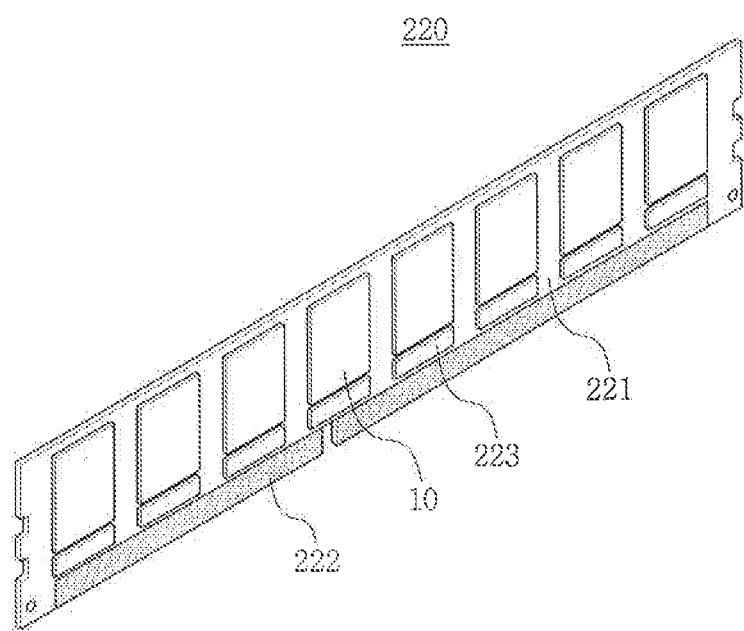
Figure 13:
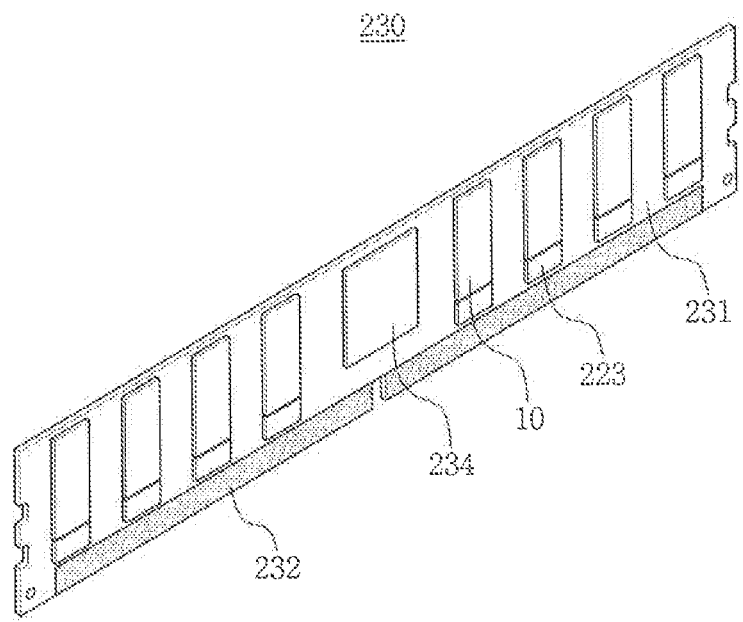

FIGS. 11 through 13 are diagrams of memory modules 210 to 230 including the semiconductor memory device of FIG. 1.

Referring to FIG. 11, the memory module 210 includes a plurality of semiconductor memory devices 10, a printed circuit board (PCB) 211, and a connector 212. The plurality of semiconductor memory devices 10 is mounted on the top and bottom surfaces of the PCB 211. The connector 212 is electrically connected to the plurality of semiconductor memory devices 10 through conductive wires (not shown). Also, the connector 212 is connected to a slot of an external host.

The semiconductor memory device 10 employs the DRAM 101 of FIG. 1.

Referring to FIG. 12, the memory module 220 includes a plurality of semiconductor memory devices 10, a PCB 221, a connector 222, and a plurality of buffers 223. The plurality of buffers 223 is disposed between each of the semiconductor memory devices 10 and the connector 222.

Each of the plurality of buffers 223 is respectively connected to each of the plurality of semiconductor memory devices 10. The plurality of buffers 223 is provided on the top and bottom surfaces of the PCB 221. The semiconductor memory devices 10 and the plurality of buffers 223 formed on the top and bottom surfaces of the PCB 221 may be connected through a plurality of via holes.

The semiconductor memory device 10 employs the DRAM 101 of FIG. 1.

Referring to FIG. 13, a memory module 230 includes a plurality of semiconductor memory devices 10, a printed circuit board (PCB) 231, a connector 232, a plurality of buffers 233, and a controller 234.

Each of the plurality of buffers 233 respectively connected to the plurality of semiconductor memory devices 10 is provided on the top and bottom surfaces of the PCB 231. The plurality of semiconductor memory devices 10 and the plurality of buffers 233 formed on the top and bottom surfaces of the PCB 231 may be connected through a plurality of via holes. The controller 234 provides a control signal to each of the plurality of semiconductor memory devices 10, and transmits and receives data to and from each of the semiconductor memory devices 10.

The semiconductor memory device 10 employs the DRAM 101 shown in FIG. 1.

Figure 14:
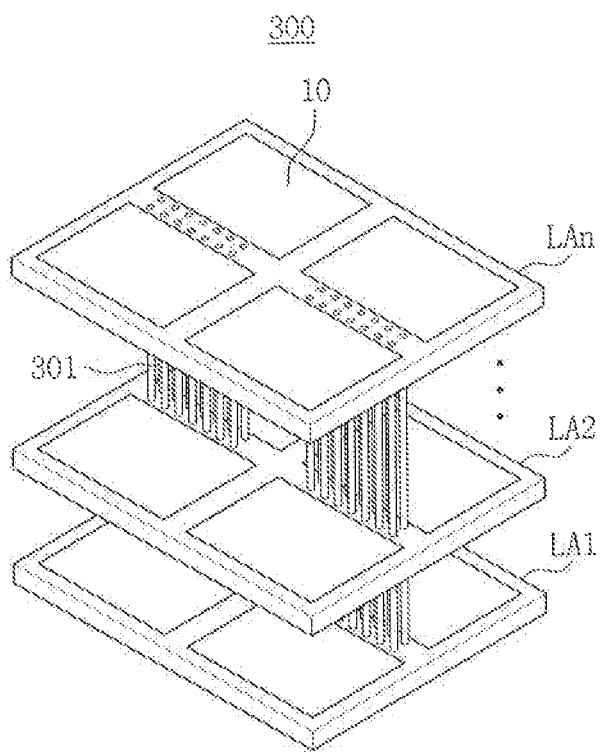
FIG. 14 is a diagram of a stack-type semiconductor device according to an exemplary embodiment of the inventive concept.

FIG. 14 is a diagram of a stack-type semiconductor device according to an exemplary embodiment of the inventive concept. In FIGS. 11 through 13, each of the semiconductor memory devices 10 may include a plurality of semiconductor layers LA1 to LAn stacked on each other.

Referring to FIG. 14, in the stack-type semiconductor device 300, the stacked semiconductor layers LA1 to LAn are connected to one another using through-silicon vias (TSVs) 301.

Figure 15:
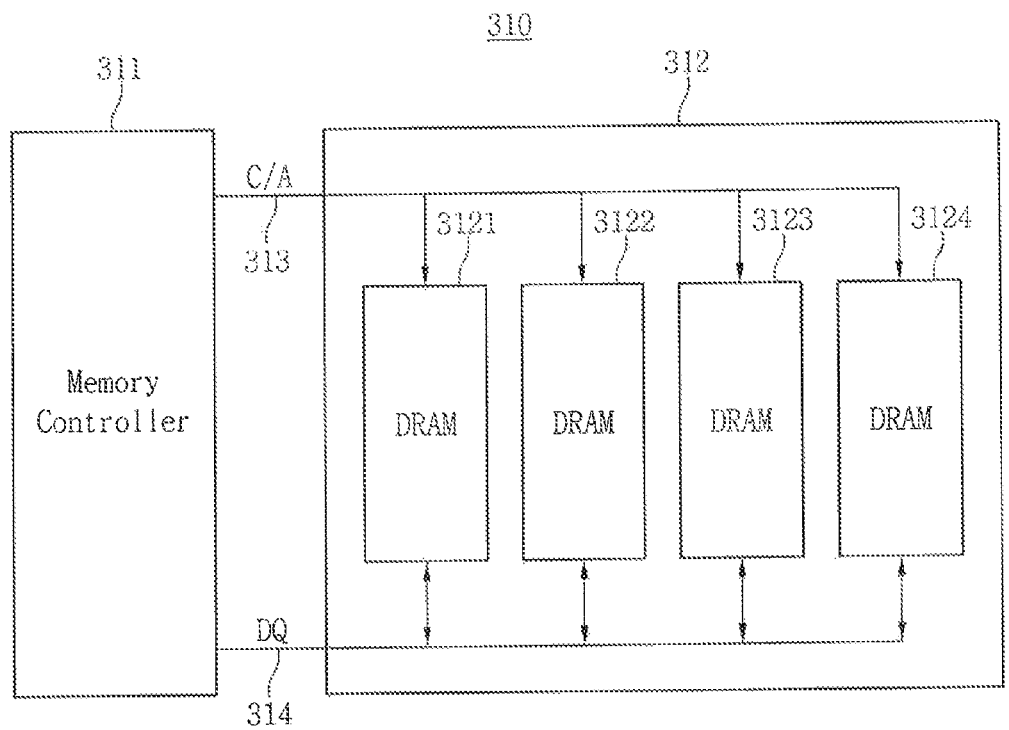
FIG. 15 is a block diagram of a memory system including the memory module of FIG. 1 according to an exemplary embodiment of the inventive concept.

FIG. 15 is a block diagram of a memory system 310 including the memory module of FIG. 1.

Referring to FIG. 15, the memory system 310 includes a memory controller 311 and a memory module 312.

For the convenience of a description, the memory module 312 includes four DRAMs. However, the inventive concept is not limited thereto, and the memory module 312 may include less than or more than four DRAMs. The DRAMs 3121 to 3124 may be mounted on both surfaces of the memory module 312.

The memory controller 311 provides a command/address signal C/A and a data signal DQ to the DRAMs 3121 to 3124. The memory module 312 operates in response to the command/address signal C/A and the data signal DQ. The command/address signal C/A may include a plurality of control signals and a plurality of input/output signals. The command/address signal C/A may be provided in parallel. Alternatively, the command/address signal may be serially provided in a packet format.

A command/address bus 313 may have a fly-by structure where the command/address signal C/A are electrically connect the first through fourth DRAMs 3121 to 5121 to each other. A data signal DQ may be transmitted and received between the memory controller 311 and the first through fourth DRAMs 3121 to 3124 constituting the memory module 312 through a data bus 314.

The memory module 312 employs the memory module 100 of FIG. 1.

Figure 16:
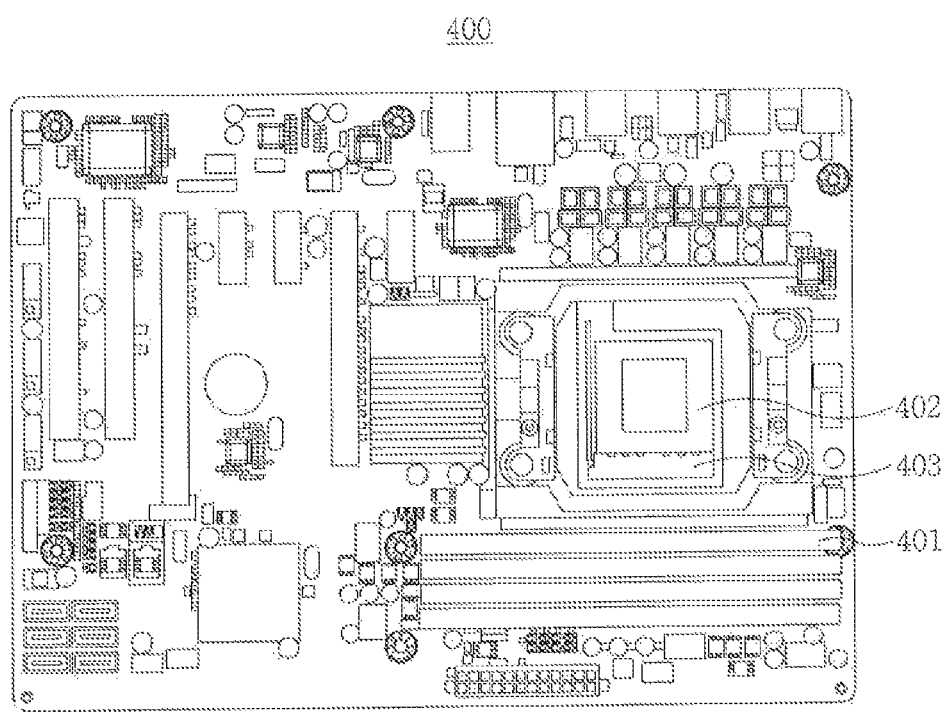
FIG. 16 illustrates a main board including the memory module of FIG. 1 according to an exemplary embodiment of the inventive concept.

FIG. 16 illustrates a main board 400 including the memory module 100 of FIG. 1.

Referring to FIGS. 1 and 16, the main board 400 includes a plurality of slots 401 into which a plurality of memory modules 100 is inserted.

The main board 400 further includes a central processing unit (CPU) 402 configured to access the plurality of memory modules 100, and a CPU socket 403 configured to mount the CPU 402.

The main board 400 contains various components for a computer system. The main board 400 may be referred to as a motherboard.

A memory controller may be mounted on the main board 400. Alternatively, a memory controller may be integrated into the CPU 402.

Figure 17:
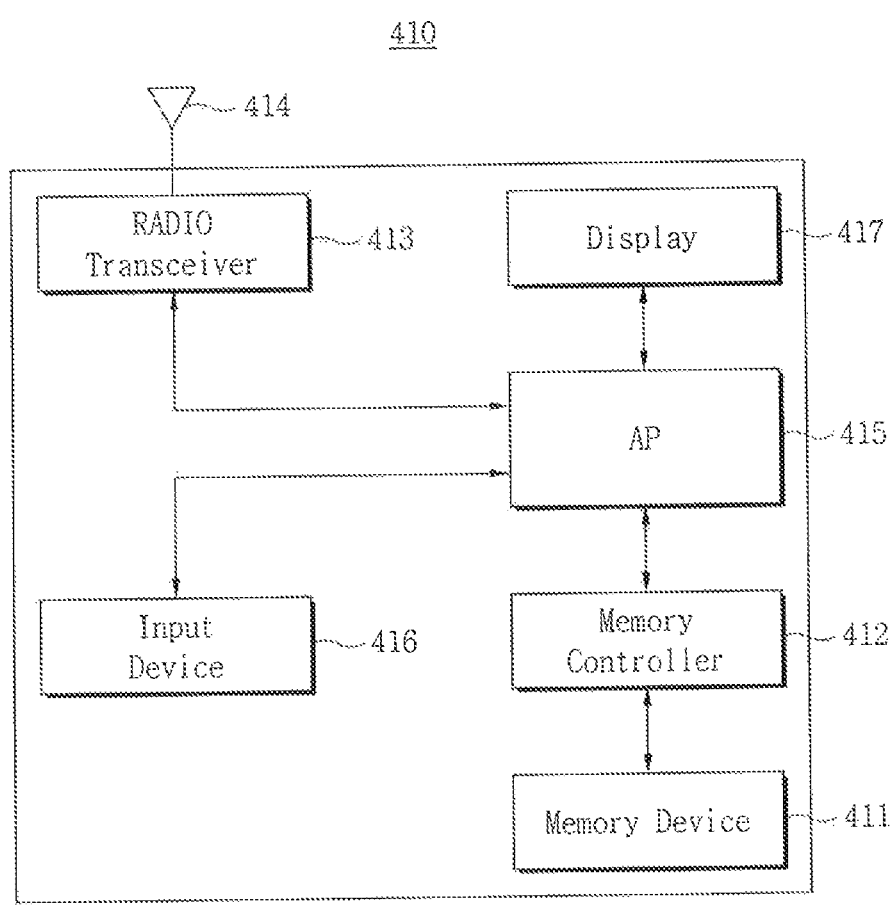
FIG. 17 is a block diagram of a computer system including the DRAM of FIG. 3 according to an exemplary embodiment of the inventive concept.

FIG. 17 is a diagram of a computer system 410 including the DRAM 101 of FIG. 3 according to an exemplary embodiment of the inventive concept.

Referring to FIG. 17, the computer system 410 includes a memory device 411, a memory controller 412 configured to control the memory device 411, a wireless transceiver 413, an antenna 414, an application processor (AP) 415, an input device 416, and a display 417.

The wireless transceiver 413 transmits or receives wireless signals through the antenna 414. For example, the wireless transceiver 413 converts a wireless signal received through the antenna 414 into a signal that is processed by the AP 415.

The AP 415 processes a signal output by the wireless transceiver 4120, and transmits the processed signal to the display 417. Also, the wireless transceiver 413 converts a signal output by the AP 415 into a wireless signal, and output the converted wireless signal to an external device through the antenna 414.

The input device 416 generates a control signal for controlling operations of the AP 415, or data to be processed by the AP 415. The input device 416 includes a pointing device, such as a touch pad and a computer mouse, a keypad, or a keyboard.

The memory controller 412 may be integrated into the AP 415.

The memory device 411 employs the memory module 100 of FIG. 1.

Figure 18:
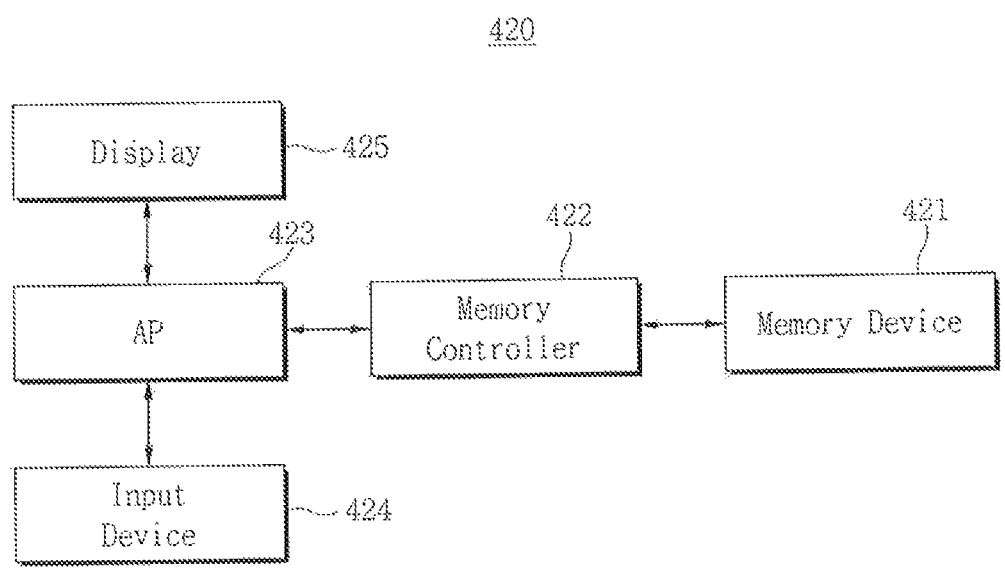
FIG. 18 is a block diagram of a computer system including the DRAM of FIG. 3 according to an exemplary embodiment of the inventive concept.

FIG. 18 is a block diagram of a computer system 420 including the DRAM of in FIG. 3 according to an exemplary embodiment of the inventive concept.

Referring to FIG. 18, the computer system 420 includes a personal computer (PC) a network server, a tablet PC, a net-book, an e-reader, a personal digital assistant (PDA), a portable multimedia player (PMP), an MP3 player, or an MP4 player.

The computer system 420 includes a memory module 421, a memory controller 422 capable of controlling data processing operations of the memory module 421, an AP 423, an input device 424, and a display 425.

The AP 423 may display data, which is stored in the memory module 421 according to data input through the input device 424, through the display 425. For example, the input device 424 may include a pointing device, such as a touch pad or a computer mouse, a keypad, or a keyboard. The AP 423 may control overall operations of the computer system 420, and control operations of the memory controller 422.

The memory controller 422 may be integrated into the AP 423.

The memory device 421 is employed in the memory module 100 of FIG. 1.

Figure 19:
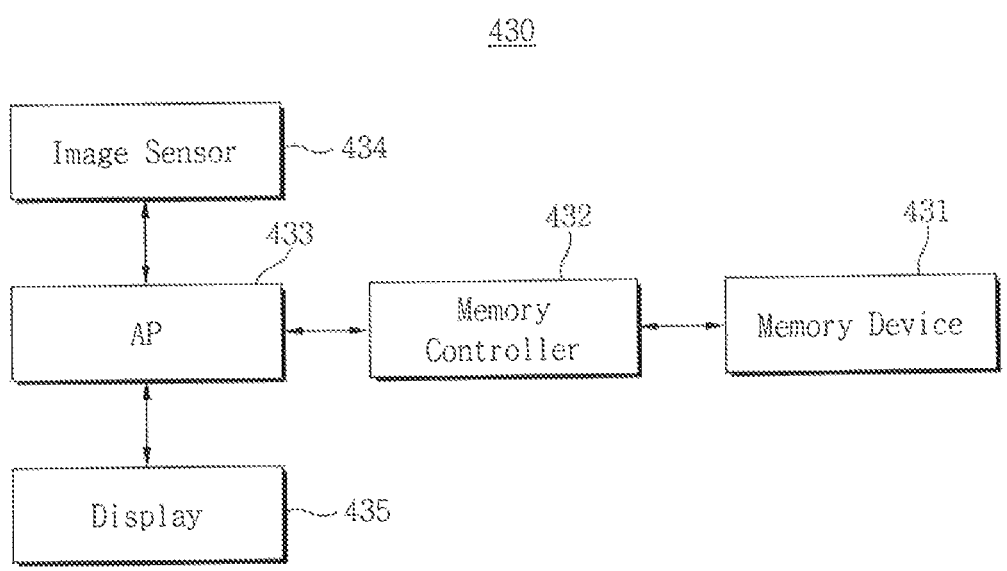
FIG. 19 is a block diagram of a computer system including the DRAM of FIG. 3 according to an exemplary embodiment of the inventive concept.

FIG. 19 is a block diagram of a computer system 430 including the DRAM of FIG. 3 according to an exemplary embodiment of the inventive concept.

Referring to FIG. 19, the computer system 430 may include an image process device, for example, a digital camera or a mobile phone, a smart phone, or a tablet to which a digital camera is adhered.

The computer system 430 includes a memory module 431 and a memory controller 432 capable of controlling a data processing operation of the memory module 431, for example, a write operation or a read operation. Also, the computer system 430 further includes an AP 433, an image sensor 434, and a display 435.

The image sensor 434 of the computer system 430 converts an optical image into digital signals, and the converted digital signals are transmitted to the AP 433 or the memory controller 432. Under the control of the AP 433, the converted digital signals are displayed through the display 435, or stored in the memory module 431 by the memory controller 432.

The data stored in the memory module 431 is displayed though the display 435 under the control of the AP 433 or the memory controller 432.

The memory controller 432 may be integrated into the AP 433.

The memory device 431 employs the memory module 100 of FIG. 1.

According to an exemplary embodiment, a refresh period or AC/DC parameters of a semiconductor memory device mounted on the memory module may be adjusted based on a relative position of the semiconductor device with respect to a register of the memory module.

Furthermore, exemplary embodiments of the inventive concept may provide a method of repairing a memory module when failures occur in a mass production operation of the memory module.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A memory module, comprising:
a register disposed at a center region of the memory module;
a first DRAM disposed at a first distance from the register, wherein the first DRAM operates at a first operating parameter; and
a second DRAM disposed at a second distance from the register, wherein the second DRAM operates at a second operating parameter,
wherein the first operating parameter is different from the second operating parameter, and
wherein the first operating parameter and the second operating parameter are set according to respective positions of the first DRAM and the second DRAM from the register.

2. The memory module of claim 1,
wherein the first operating parameter includes a first refresh period and the second operating parameter includes a second refresh period,
wherein the first DRAM is set to the first refresh period based on the first distance,
wherein the second DRAM is set to the second refresh period based on the second distance.

3. The memory module of claim 1,
wherein each of the first DRAM and the second DRAM comprises:
a data storage unit;
an I/O buffer coupled to the data storage unit;
a latency controller adjusting latency of the I/O buffer based on the first distance,
wherein the first operating parameter includes the latency of the first DRAM and the second operating parameter includes the latency of the second DRAM.

4. The memory module of claim 1,
wherein each of the first DRAM and the second DRAM further comprises:
a data storage unit;
a DC generator supplying internal voltage to the data storage unit, and wherein the first operating parameter includes the internal voltage of the first DRAM and the second operating parameter includes the internal voltage of the second DRAM.

5. The memory module of claim 1, wherein each of the first DRAM and the second DRAM further comprises:
a data storage unit;
a fuse block storing a refresh period setting value;
a refresh controller refreshing the data storage unit; and
a refresh period controller generating a refresh period of the data storage unit, and
wherein the first operating parameter includes the refresh period of the first DRAM and the second operating parameter includes the refresh period of the second DRAM.

6. The memory module of claim 5, wherein the refresh period controller of the first DRAM controls the refresh controller of the first DRAM to select a first number of word lines to be simultaneously refreshed, wherein the refresh controller of the second DRAM controls the refresh controller of the second DRAM to select a second number of word lines to be simultaneously refreshed, and wherein the first number is different from the second number.

7. The memory module of claim 3, wherein the latency controller adjusts time points of a RAS-to-CAS delay time (tRCD) and a write recovery time (tWR) based on the first distance.

8. The memory module of claim 4, wherein the internal voltage includes a bit line voltage, a body bias voltage, and a cell plate voltage.

9. The memory module of claim 1, wherein the first DRAM comprises:
a data storage unit;
a DC generator configured to supply internal voltage to the data storage unit;
a fuse block configured to store a DC setting value; and
a DC controller configured to control the DC generator to adjust the internal voltage based on the DC setting value.

10. The memory module of claim 1, wherein all memory cells of the first DRAM operate at the first operating parameter, and all memory cells of the second DRAM operate at the second operating parameter.

11. A memory module, comprising:
a register disposed at a center region of the memory module;
a first DRAM disposed at a first distance from the register, wherein the first DRAM operates at a first operating parameter; and
a second DRAM disposed at a second distance from the register, wherein the second DRAM operates at a second operating parameter,
a third DRAM disposed at a third distance from the register, wherein the third DRAM operates at a third operating parameter,
wherein the first operating parameter is different from the second operating parameter, and wherein the first distance is substantially equal to the third distance and the first operating parameter is substantially equal to the third operating parameter.

* * * * *